United States Patent
Nakao

(10) Patent No.: US 7,428,155 B2
(45) Date of Patent: Sep. 23, 2008

(54) PRINTED WIRING BOARD INCLUDING POWER SUPPLY LAYER AND GROUND LAYER

(75) Inventor: Tomoyuki Nakao, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 408 days.

(21) Appl. No.: 11/376,331

(22) Filed: Mar. 16, 2006

(65) Prior Publication Data

US 2007/0144770 A1    Jun. 28, 2007

(30) Foreign Application Priority Data

Dec. 26, 2005   (JP) .............................. 2005-371512

(51) Int. Cl.
   *H05K 1/11*   (2006.01)
   *H05K 1/14*   (2006.01)

(52) U.S. Cl. ...................... 361/794; 361/792; 361/795

(58) Field of Classification Search ......... 361/765–766, 361/792–795
See application file for complete search history.

(56) References Cited

U.S. PATENT DOCUMENTS 6,104,258 A * 8/2000 Novak ...................... 333/22 R
6,166,457 A * 12/2000 Iguchi et al. .................. 307/91
6,198,362 B1 * 3/2001 Harada et al. ................. 333/12
6,937,480 B2 * 8/2005 Iguchi et al. ................ 361/780

FOREIGN PATENT DOCUMENTS

JP    6-244562    9/1994
JP    11-233951   8/1999

* cited by examiner

*Primary Examiner*—Tuan T Dinh
(74) *Attorney, Agent, or Firm*—Kratz, Quintos & Hanson, LLP

(57) ABSTRACT

A first power supply layer spreads over an insulating layer outside an island of a second power supply layer. A first ground layer spreads over an insulating layer outside an island of a second ground layer. First and second electrically-conductive pieces are interposed between the first and second power supply layers as well as between the first and second ground layers. A capacitor is interposed between the first and second electrically-conductive pieces. Power supply noise is forced to inevitably pass through the electrically-conductive pieces. The power supply noise thus reliably flows into the capacitor through the first and second electrically-conductive pieces. A printed wiring board is in this manner allowed to enjoy a sufficient suppression of the power supply noise.

9 Claims, 6 Drawing Sheets

PRINTED WIRING BOARD INCLUDING POWER SUPPLY LAYER AND GROUND LAYER

BACKGROUND OF THE INVENTION

1. Field of the Invention

The present invention relates to a printed wiring board including an electrically-conductive power supply layer and an electrically-conductive ground layer.

2. Description of the Prior Art

A printed wiring board usually includes an electrically-conductive power supply layer and an electrically-conductive ground layer. A LSI (Large-Scale Integrated circuit) chip is mounted on the surface of the printed wiring board. The LSI chip is connected to the electrically-conductive power supply layer and the electrically-conductive ground layer. A chip capacitor, namely a bypass capacitor, is connected to the electrically-conductive power supply layer and the electrically-conductive ground layer. The bypass capacitor serves to reduce power supply noise.

Japanese Patent Application Publication Nos. 6-244562 and 11-233951 disclose an island of an electrically-conductive power supply layer and an island of an electrically-conductive ground layer, for example. The bypass capacitor is connected to the power supply and ground layers through vias. In this case, power supply noise is allowed to spread over the entire power supply and ground layers. Power supply noise cannot sufficiently be reduced. The power supply noise causes radiation of electromagnetic waves from the printed wiring board.

SUMMARY OF THE INVENTION

It is accordingly an object of the present invention to provide a printed wiring board capable of reliably reducing power supply noise.

According to the present invention, there is provided a printed wiring board comprising: a first insulating layer; a first electrically-conductive power supply layer formed on the surface of the first insulating layer; an island of a second electrically-conductive power supply layer contoured based on a projected image of an electronic circuit element, the second electrically-conductive power supply layer isolated from the first electrically-conductive power supply layer on the surface of the first insulating layer; a first electrically-conductive piece connecting the second electrically-conductive power supply layer to the first electrically-conductive power supply layer; a second insulating layer; a first electrically-conductive ground layer formed on the surface of the second insulating layer; an island of a second electrically-conductive ground layer contoured based on a projected image of the electronic circuit element, the second electrically-conductive ground layer isolated from the first electrically-conductive ground layer on the surface of the second insulating layer; a second electrically-conductive piece connecting the second electrically-conductive ground layer to the first electrically-conductive ground layer; and a capacitor connected to the first and second electrically-conductive pieces.

The printed wiring board enables supply of electric current from the first electrically-conductive power supply layer to the second electrically-conductive power supply layer. The electric current then flows into the electronic circuit element from the second electrically-conductive power supply layer. The electronic circuit element operates in response to the supply of the electric current. The operating current of the electronic circuit element is allowed to flow into the second electrically-conductive ground layer. The operating current flows into the first electrically-conductive ground layer from the second electrically-conductive ground layer. The operating current then flows outside the printed wiring board from the first electrically-conductive ground layer.

The first electrically-conductive piece serves to narrow the path of electric current from the first electrically-conductive power supply layer to the second electrically-conductive power supply layer. The second electrically-conductive piece likewise serves to narrow the path of electric current from the second electrically-conductive ground layer to the first electrically-conductive ground layer. Noise in the electric current, namely power supply noise is forced to inevitably pass through the electrically-conductive pieces. The power supply noise thus reliably flows into the capacitor through the first and second electrically-conductive pieces. The printed wiring board is in this manner allowed to enjoy a sufficient suppression of the power supply noise. Electromagnetic waves are reliably prevented from radiation from the printed wiring board. The second electrically-conductive piece may preferably be contoured at least partly based on a projected image of the first electrically-conductive piece.

The first electrically-conductive piece may be connected to the second electrically-conductive power supply layer at a position closer to a clock terminal of the electronic circuit element. Likewise, the second electrically-conductive piece is connected to the second electrically-conductive ground layer at a position closer to a clock terminal of the electronic circuit element. The return current of a clock signal is thus allowed to circulate in the shortest path. The waveform is prevented from deformation in the clock signal. Noise can surely be suppressed. The printed wiring board is allowed to enjoy a suppressed radiation of electromagnetic waves resulting from the clock signal.

The first electrically-conductive power supply layer may be divided into islands of electrically-conductive layers isolated from each other on the first insulating layer. Separate electric currents can be supplied to the islands of the electrically-conductive layers. The electronic circuit element may receive separate electric currents from the islands of the electrically-conductive layers. The various kinds or levels of the operating voltages may be supplied to the electronic circuit element.

The combination of the first and second electrically-conductive power supply layers and the first electrically-conductive piece and the combination of the first and second electrically-conductive ground layers and the second electrically-conductive piece may alternately be layered on one another in the printed wiring board. Such a layered structure serves to enhance the interlayer capacitance between the island of the second electrically-conductive power supply layer and the island of the second electrically-conductive ground layer. This increase in the capacitance serves to enhance reduction of power supply noise.

The first electrically-conductive ground layer may at least partly overlap a projected image of the second electrically-conductive power supply layer. This results in establishment of an electrostatic coupling of a smaller capacitance between the first electrically-conductive ground layer and the second electrically-conductive power supply layer. The electrostatic coupling serves to suppress deformation of waveform in a signal of the gigahertz unit.

The printed wiring board may further comprise: a third insulating layer; a third electrically-conductive power supply layer formed on the surface of the third insulating layer; an island of a fourth electrically-conductive power supply layer contoured based on a projected image of the electronic circuit element, the fourth electrically-conductive power supply layer isolated from the third electrically-conductive power supply layer on the surface of the third insulating layer; and a third electrically-conductive piece connecting the fourth electrically-conductive power supply layer to the third electrically-conductive power supply layer. The printed wiring board of the type enables supply of electric current separately from the islands of the second and fourth electrically-conductive layers. The electronic circuit element can receive electric currents of different operating voltages.

Otherwise, the printed wiring board may further comprise: a third insulating layer; a third electrically-conductive ground layer formed on the surface of the third insulating layer; an island of a fourth electrically-conductive ground layer contoured based on a projected image of the electronic circuit element, the fourth electrically-conductive ground layer isolated from the third electrically-conductive ground layer on the surface of the third insulating layer; a third electrically-conductive piece connecting the fourth electrically-conductive ground layer to the third electrically-conductive ground layer; and vias connecting the second and fourth electrically-conductive ground layers to each other at positions outside the second electrically-conductive power supply layer located in a space between the second and fourth electrically-conductive ground layers. The vias function as a shield for the island of the second electrically-conductive power supply layer. This results in a significant reduction of radiation of electromagnetic waves from the second electrically-conductive power supply layer.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
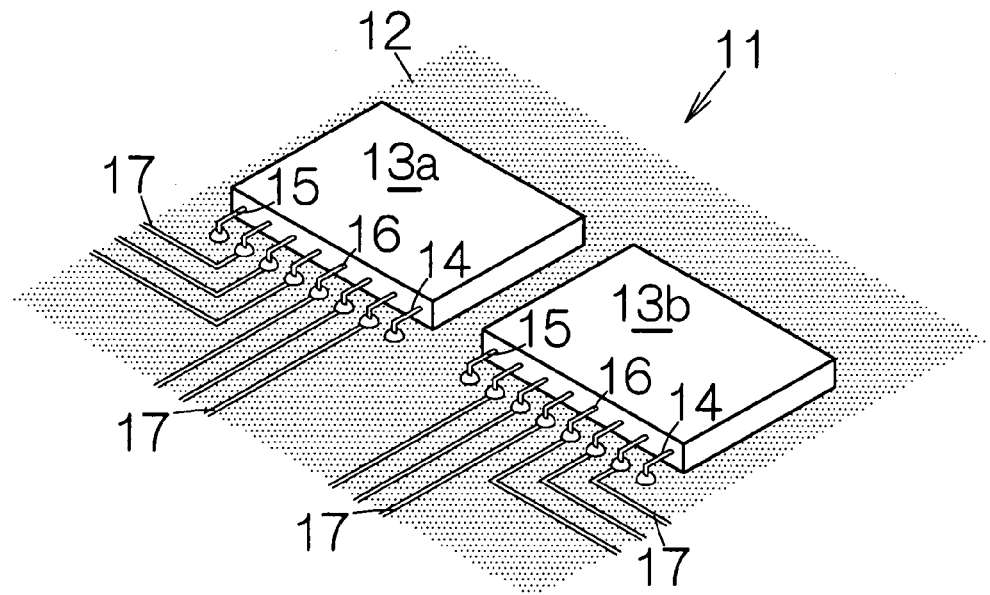
FIG. 1 is a perspective view illustrating a part of a printed circuit board unit according to an embodiment of the present invention.

FIG. 1 schematically illustrates a printed circuit board unit 11 according to an embodiment of the present invention. The printed circuit board unit 11 includes a printed wiring board 12. One or more LSI (Large-Scale Integrated circuit) chip or chips 13a, 13b, . . . are mounted on the front surface of the printed wiring board 12, for example. A power supply pin 14, a ground pin 15 and signal pins 16 are connected to each of the LSI chips 13a, 13b.

Wiring patterns 17 are formed on the surface of the printed wiring board 12. The wiring patterns 17 may be made of an electrically-conductive material such as copper, for example. The signal pins 16 are soldered to the corresponding wiring patterns 17, respectively.

Figure 2:
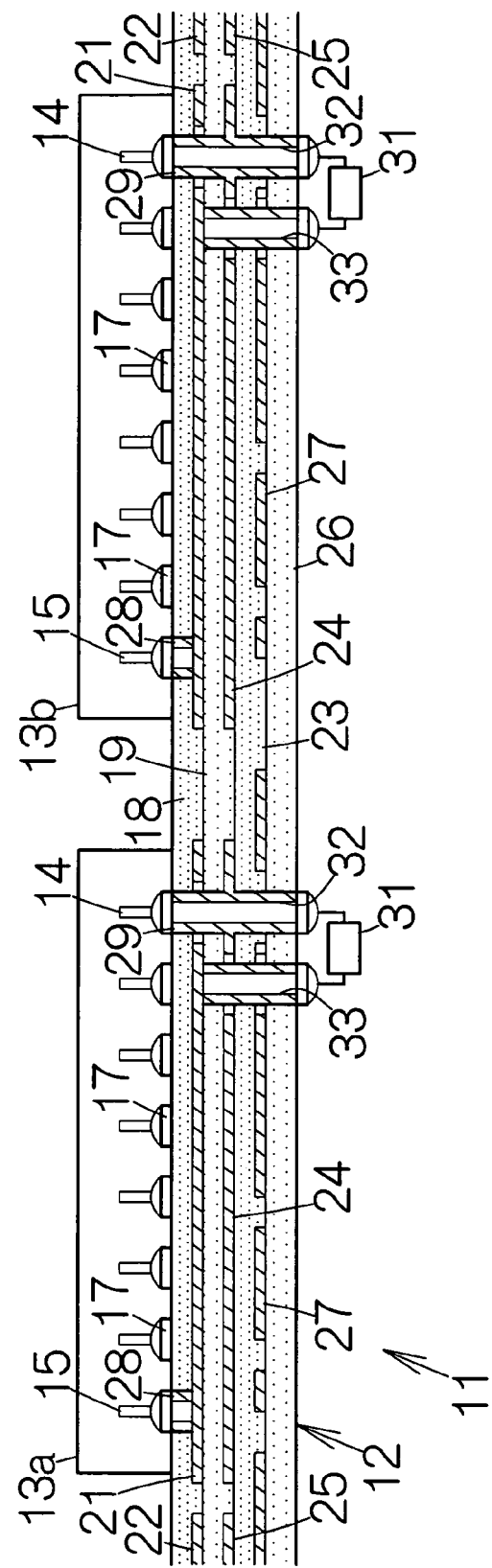
FIG. 2 is an enlarged partial vertical sectional view schematically illustrating the structure of a printed wiring board in the printed circuit board unit.

As shown in FIG. 2, the wiring patterns 17 are received on the uppermost layer of the printed wiring board 12, namely the upper surface of a first insulating layer 18. The first insulating layer 18 is received on the upper surface of a second insulating layer 19. Islands of electrically-conductive ground layers 21, 21 are formed on the upper surface of the second insulating layer 19. The islands of ground layers 21 are individually contoured based on the projected images of the LSI chips 13a, 13b, as described later in detail.

An electrically-conductive ground layer 22 is formed outside the islands of the ground layers 21, 21 on the upper surface of the second insulating layer 19. The electrically-conductive ground layer 22 is isolated from the islands of ground layers 21 on the upper surface of the second insulating layer 19. In this case, the islands of the ground layers 21, 21 are also isolated from each other on the upper surface of the second insulating layer 19.

The second insulating layer 19 is received on the upper surface of a third insulating layer 23. Islands of electrically-conductive power supply layers 24, 24 are formed on the upper surface of the third insulating layer 23. The islands of the power supply layers 24 are individually contoured based on the projected images of the LSI chips 13a, 13b, as described later in detail.

An electrically-conductive power supply layer 25 is formed outside the islands of the power supply layers 24, 24 on the upper surface of the third insulating layer 23. The electrically-conductive power supply layer 25 is isolated from the islands of the power supply layers 24 on the upper surface of the third insulating layer 23. In this case, the islands of the power supply layers 24, 24 are also isolated from each other on the upper surface of the third insulating layer 23.

The third insulating layer 23 is received on the upper surface of a fourth insulating layer 26. Wiring patterns 27 are formed on the upper surface of the fourth insulating layer 26, for example. The wiring patterns 27 may electrically be connected to the aforementioned wiring patterns 17, for example. Vias, not shown, may be formed in the printed wiring board 12 for the electric connection. The vias may penetrate through the first to third insulating layers 18, 29, 23. The wiring patterns 27 may be made of an electrically-conductive material such as copper, for example.

Vias 28 are connected to the islands of the ground layers 21, 21, respectively. The vias 28 are designed to stand upright from the upper surfaces of the ground layers 21. The vias 28 penetrate through the first insulating layer 18. The ground pins 15 of the LSI chips 13a, 13b are connected to the upper or top ends of the vias 28, respectively. Electrical connection is in this manner established between the islands of the ground layers 21 and the LSI chips 13a, 13b, respectively.

Vias 29 are likewise connected to the islands of the power supply layers 24, 24, respectively. The vias 29 are designed to stand upright from the upper surfaces of the power supply layers 24. The vias 29 penetrate through the first and second insulating layers 18, 19 as well as the islands of the ground layers 21. In this case, a through hole is formed in each of the islands of the ground layers 21. The vias 29 are located inside the corresponding through holes. Electrical connection is in this manner avoided between the vias 29 and the islands of the ground layers 21.

Chip capacitors 31 are mounted on the back or lower surface of the fourth insulating layer 26. Each of the chip capacitors 31 is assigned to each of the LSI chips 13a, 13b. The chip capacitor 31 is connected to the island of the ground layer 21 and the corresponding island of the power supply layer 24. Vias 32, 33 are formed in the printed wiring board 12. The via 32 is connected to the via 29. The via 32 penetrates through the third and fourth insulating layers 23, 26. Contact is avoided between the vias 32 and the wiring patterns 27. The via 33 is connected to the island of the ground layer 21. The via 33 penetrates through the second to fourth insulating layers 19, 23, 26. Contact is avoided between the vias 33 and the wiring patterns 27 as well as between the vias 33 and the island of the power supply layer 24. Specifically, a through hole is defined in the islands of the power supply layers 24. The via 33 is located inside the through hole. The chip capacitors 31 serve to suppress deformation of waveform in signals as input and output of the LSI chips 13a, 13b, respectively. The capacitance of the chip capacitors 31 depends on the operating frequency of the LSI chips 13a, 13b. In this case, the chip capacitors 31 may have a capacitance in the microfarad unit, for example.

Figure 3:
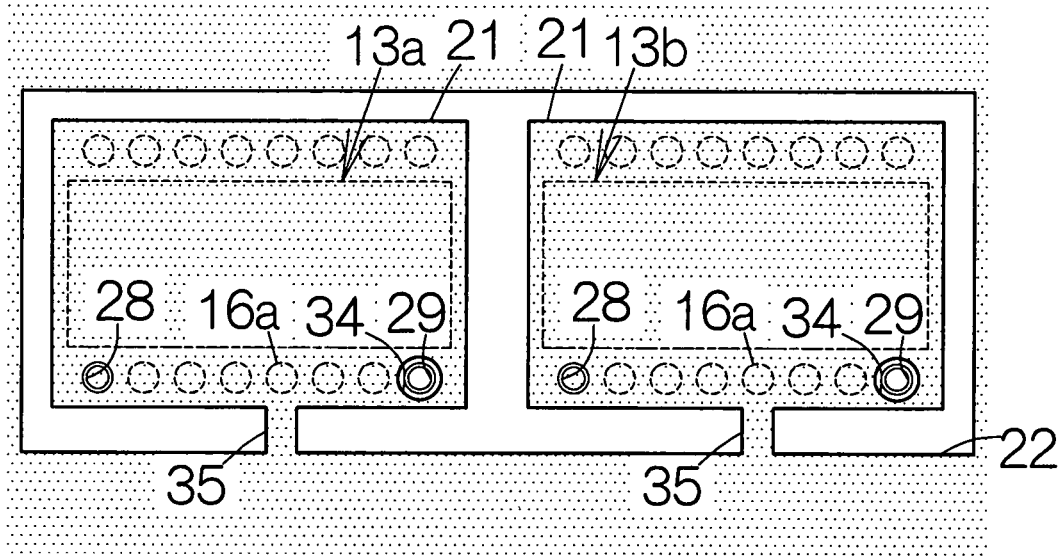
FIG. 3 is an enlarged plan view schematically illustrating islands of ground layers and an electrically-conductive ground layer on the upper surface of an insulating layer.

As shown in FIG. 3, the islands of the ground layers 21, 21 are contoured based on the projected images of the LSI chips 13a, 13b, respectively. Each projected image includes not only the semiconductor itself but also the electrode terminals such as the power supply pin 14 and the ground pin 15. The island of the ground layer 21 may extend larger or wider than the corresponding projected image as long as the island of the ground layer 21 is prevented from superposition on the projected image of the adjacent LSI chip 13a, 13b. A through hole 34 is defined in each of the ground layers 21. The through hole 34 is located at a position aligned with the projected image of the power supply pin 14. The via 29 is located inside the corresponding through hole 34.

An electrically-conductive piece 35 is located between the island of the ground layer 21 and the ground layer 22 on the upper surface of the second insulating layer 19. The electrically-conductive piece 35 serves to establish an electric connection between the island of the ground layer 21 and the ground layer 22. The electrically-conductive piece 35 serves to narrow the path of electric current. The electrically-conductive piece 35 should have a narrowness enough to avoid a significant increase in the electric resistance. In this manner, only the electrically-conductive pieces 35 provide the paths of electric current between the islands of the ground layers 21 and the ground layer 22 surrounding the ground layers 21. The electrically-conductive piece 35 is connected to the corresponding ground layer 21 at a position closest to the clock pin 16a of the LSI chip 13a, 13b. The clock pins 16a are connected to clock drivers within the LSI chips 13a, 13b, respectively.

Figure 4:
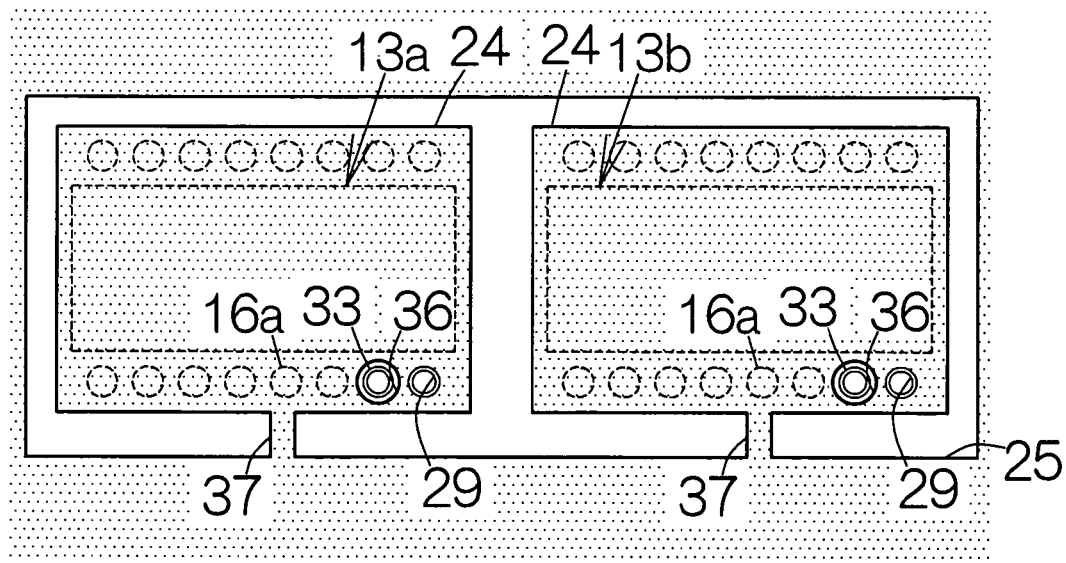
FIG. 4 is an enlarged plan view schematically illustrating islands of power supply layers and an electrically-conductive power supply layer on the upper surface of an insulating layer.

As shown in FIG. 4, the islands of the power supply layers 24, 24 are likewise contoured based on the projected images of the LSI chips 13a, 13b, respectively. Each projected image includes not only the semiconductor itself but also the electrode terminals such as the power supply pin 14 and the ground pin 15. The island of the power supply layer 24 may extend larger or wider than the corresponding projected image as long as the island of the power supply layer 24 is prevented from superposition on the projected image of the adjacent LSI chip 13a, 13b. It is desirable that the contour of the power supply layer 24 is mated with the projected image of the corresponding ground layer 21. A through hole 36 is defined in each of the power supply layers 24. The via 33 is located inside the corresponding through hole 36.

An electrically-conductive piece 37 is located between the island of the power supply layer 24 and the power supply layer 25 on the upper surface of the third insulating layer 23. The electrically-conductive piece 37 serves to establish an electric connection between the island of the power supply layer 24 and the power supply layer 25. The electrically-conductive piece 37 serves to narrow the path of electric current. The electrically-conductive piece 37 should have a narrowness enough to avoid a significant increase in the electric resistance. In this manner, only the electrically-conductive pieces 37 provide the paths of electric current between the island of the power supply layers 24 and the power supply layer 25 surrounding the power supply layers 24. The electrically-conductive piece 37 is connected to the corresponding power supply layer 24 at a position closest to the clock pin 16a of the LSI chip 13a, 13b. The contours of the electrically-conductive pieces 37 are mated with the projected images of the corresponding electrically-conductive pieces 35, respectively. The electrically-conductive pieces 35, 37 are opposed to each other across the second insulating layer 19.

Figure 5:
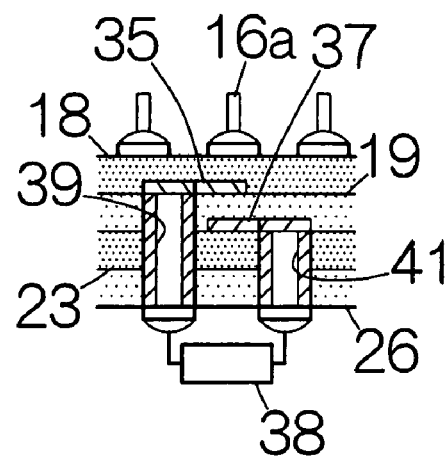
FIG. 5 is an enlarged partial vertical sectional view schematically illustrating the connection between the islands of ground layers and the islands of power supply layers.

As shown in FIG. 5, chip capacitors 38 are mounted on the lower surface of the fourth insulating layer 26. Each of the chip capacitors 38 is assigned to each of the LSI chips 13a, 13b. Each chip capacitor 38 is connected to the corresponding electrically-conductive pieces 35, 37. Vias 39, 41 are formed in the printed wiring board 12 to establish the connection. The via 39 is connected to the electrically-conductive piece 35. The via 39 penetrates through the second to fourth insulating layers 19, 23, 26. The via 41 is connected to the electrically-conductive piece 37. The via 41 penetrates through the third and fourth insulating layers 23, 26. The via 39 is shifted away from the electrically-conductive piece 37 and the via 41. Contact is avoided between the via 39 and the via 41 as well as between the via 39 and the electrically-conductive piece 37.

The printed circuit board unit 11 allows supply of electric current of an operating voltage to the islands of the power supply layers 24 through the power supply layer 25. The electric current is allowed to flow into the power supply pins 14 of the LSI chips 13a, 13b through the vias 29. The LSI chips 13a, 13b operate in response to supply of the electric current.

The operating current of the LSI chips 13a, 13b are allowed to flow into the islands of the ground layers 21 through the ground pins 15. The electric current then flows into the ground layer 22 from the islands of the ground layers 21. The electric current finally flows out of the printed wiring board 12 from the electrically-conductive layer 22.

In this case, the electrically-conductive piece 35, 37 serve to narrow the path of electric current flowing from the power supply layer 25 to the ground layer 22. All noise in the electric current, namely all power supply noise, is forced to pass through the electrically-conductive pieces 35, 37. The power supply noise in the electrically-conductive pieces 35, 37 is thus forced to inevitably flow into the chip capacitor 38. The power supply noise is in this manner sufficiently reduced. Electromagnetic waves is reliably prevented from radiation from the printed circuit board unit 11. In this case, the chip capacitor 38 may have a capacitance in the picofarad unit, for example.

Moreover, the electrically-conductive pieces 35, 37 are connected to the island of the ground layer 21 and the island of the power supply layer 24 at positions closest to the clock pins 16a of the LSI chips 13a, 13b, respectively. The return current of a clock signal is thus allowed to circulate in the shortest path. The waveform is prevented from deformation in the clock signal. Noise can surely be suppressed. The printed circuit board unit 11 is allowed to enjoy a suppressed radiation of electromagnetic waves resulting from the clock signal.

Figure 6:
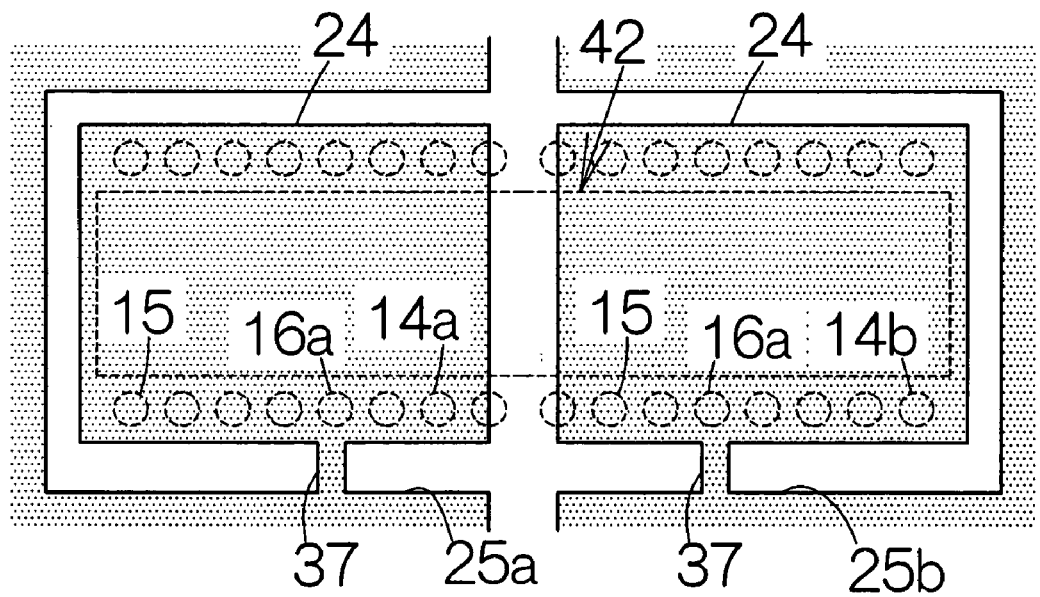
FIG. 6 is an enlarged plan view schematically illustrating a printed wiring board according to a modified embodiment.

As shown in FIG. 6, a single LSI chip 42 may be located across the islands of the power supply layers 24, 24, . . . in the printed circuit board unit 11 of the type, for example. Here, two kinds or levels of operating voltage are supplied to the LSI chip 42. In other words, the power supply pins 14a, 14b are separately connected to the corresponding power supply layers 24, 24. Electric currents of different operating voltages are supplied to the islands of the power supply layers 24, 24, respectively. Separate electrically-conductive power supply layers 25a, 25b may be connected to the islands of the power supply layers 24, 24, respectively, to supply the separate electric currents. Electrically-conductive pieces 37, 37 may be formed between the islands of the power supply layers 24 and the power supply layers 25a, 25b, respectively, in the same manner as described above. The ground pins 15 may be connected to a single ground layer 21 in common. The chip capacitor 38 may be connected to the electrically-conductive pieces 35, 37.

Figure 7:
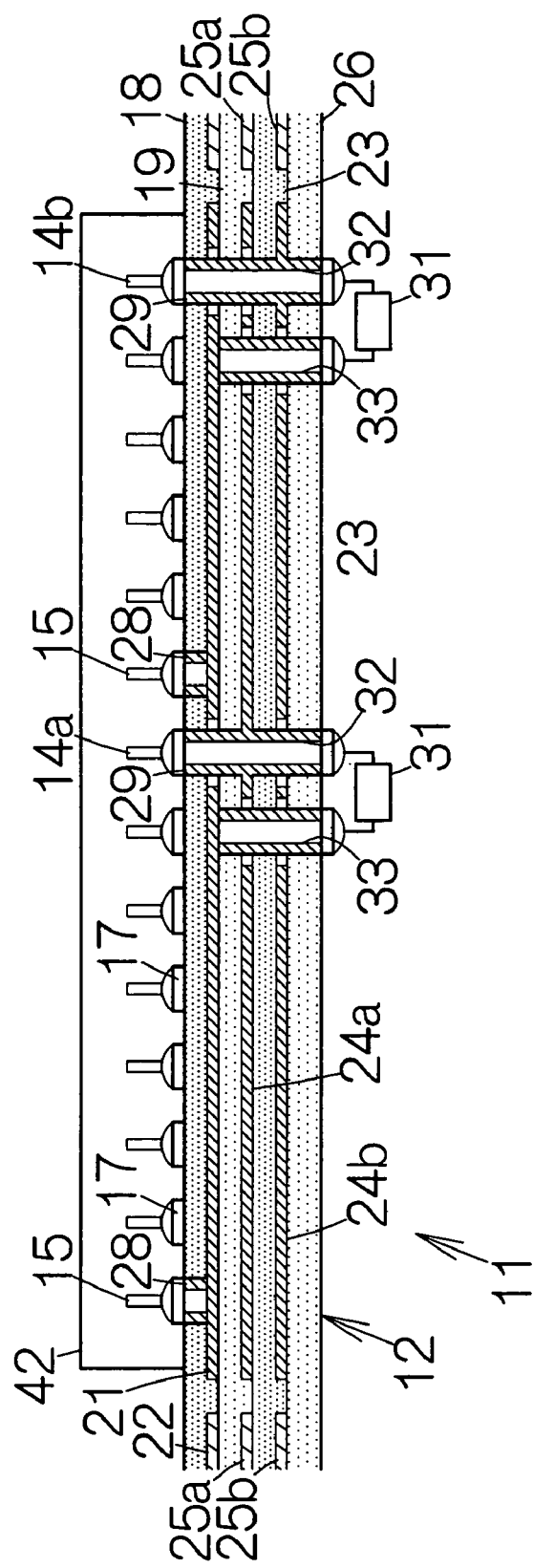
FIG. 7 is an enlarged partial vertical sectional view schematically illustrating the structure of a printed wiring board according to another modified embodiment.

In this case, islands of electrically-conductive power supply layers 24a, 24b, . . . may be assigned to the single LSI chip 42, as shown in FIG. 7. The islands of the power supply layers 24a, 24b, . . . may receive different kinds of operating voltage, respectively. The island of the power supply layer 24a and an electrically-conductive power supply layer 25a are established on the upper surface of the third insulating layer 23 in the same manner as described above. Likewise, the island of the power supply layer 24b and an electrically-conductive power supply layer 25b are established on the upper surface of the fourth insulating layer 26. Alternatively, the fourth insulating layer 26 may be received on a layered insulating material. The layered insulating material may include a set of an electrically-conductive power supply layer 24 and an electrically-conductive power supply layer 25 on the upper surface of each of the insulating layers. The sets may be assigned to electric currents of different operating voltages. The power supply pin 14a is connected to the island of the power supply layer 24a through the via 29. The power supply pin 14b is connected to the island of the power supply layer 24b through the via 29. Electric connection is avoided between the via 32 of the power supply pin 14a and the island of the power supply layer 24b. Electric connection is also avoided between the via 29 of the power supply pin 14b and the island of the power supply layer 24a. The electrically-conductive pieces 37 may be formed between the island of the power supply layer 24a and the power supply layer 25a as well as between the island of the power supply layer 24b and the power supply layer 25b in the same manner as described above. The ground pins 15 may be connected to the single ground layer 21 in common. The chip capacitors 38, 38 may be connected to the electrically-conductive pieces 37, 37, respectively.

Figure 8:
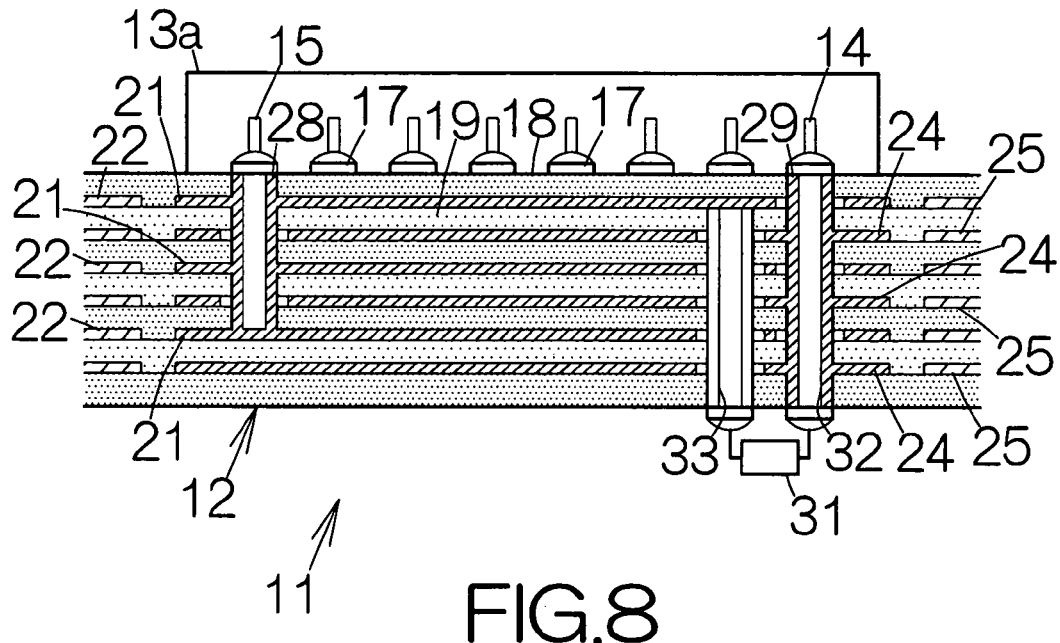
FIG. 8 is an enlarged partial vertical sectional view schematically illustrating the structure of a printed wiring board according to a further modified embodiment.

As shown in FIG. 8, the islands of the ground layers 21, 21, . . . and the islands of the power supply layers 24, 24, . . . may alternately be layered on one another in the printed circuit board unit 11, for example. Such a layered structure serves to enhance the interlayer capacitance between the islands of the ground layers 21 and the islands of the power supply layers 24. This increase in the capacitance serves to enhance reduction of power supply noise. The chip capacitor 38 may be connected between one of the ground layers 21 and one of the power supply layers 24.

Figure 9:
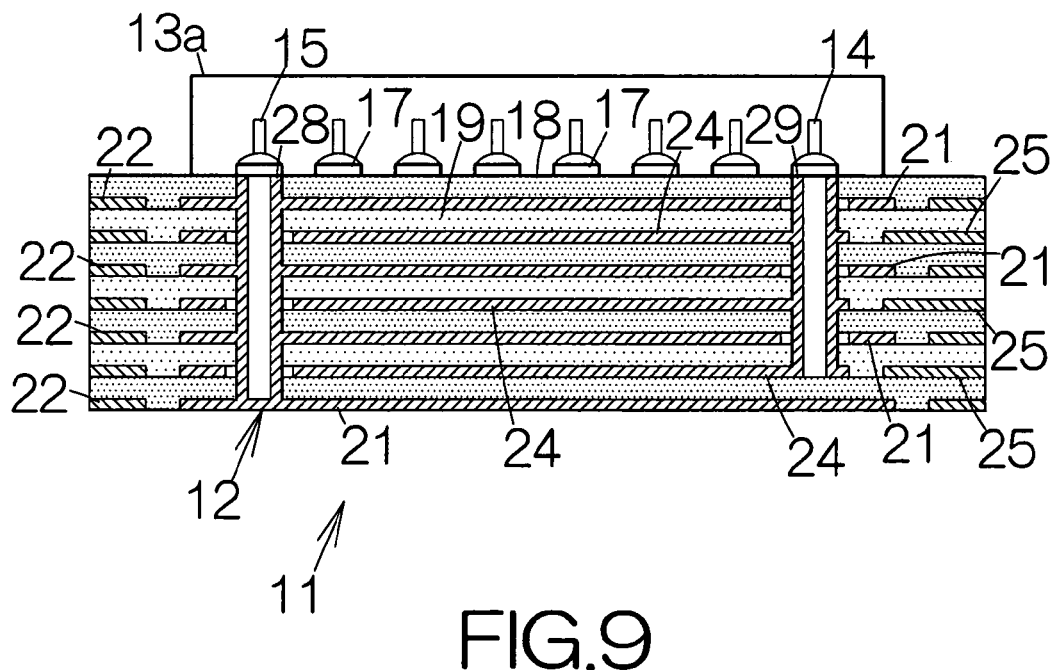
FIG. 9 is an enlarged partial vertical sectional view schematically illustrating the structure of a printed wiring board according to a still further modified embodiment.

Alternatively, the islands of the ground layers 21 may overlap the projected image of the power supply layer 25 in the adjacent layer in the printed circuit board unit 11, as shown in FIG. 9. This results in establishment of an electrostatic coupling of a smaller capacitance between the adjacent layers. The electrostatic coupling serves to suppress deformation of waveform in a signal of the gigahertz (GHz) unit. The islands of the ground layers 21 may completely be separated from the surrounding ground layer 22. Likewise, the islands of the power supply layers 24 may completely be separated from the surrounding power supply layer 25. The chip capacitor 38 may be connected between one of the ground layers 21 and one of the power supply layers 24.

Figure 10:
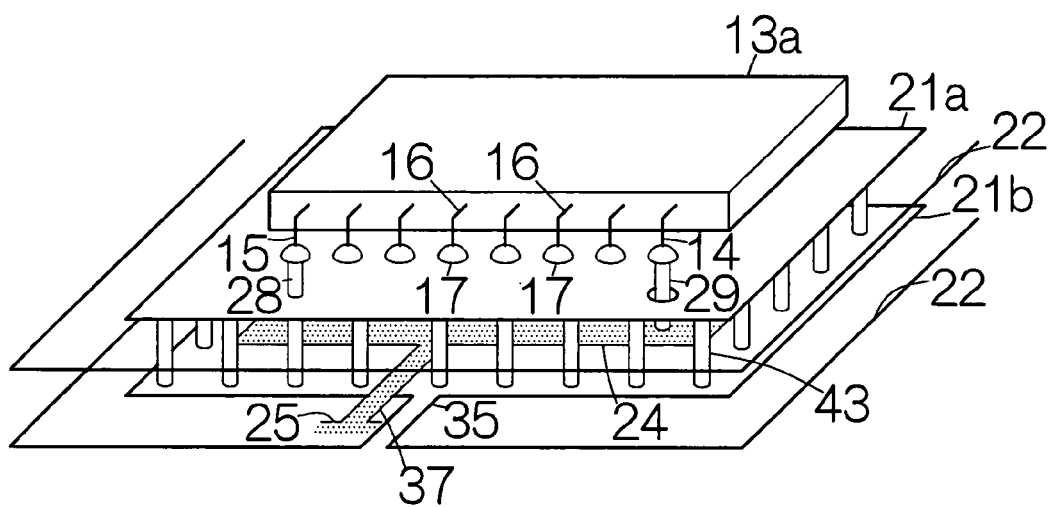
FIG. 10 is an enlarged partial perspective view schematically illustrating the structure of a printed wiring board according to a still further modified embodiment.

As shown in FIG. 10, vias 43, 43, . . . , maybe formed to connect the islands of the ground layers 21a, 21b to each other around the island of the power supply layer 24 in the printed circuit board unit 11. In this case, the island of the ground layer 21a is formed on the upper surface of the second insulating layer 19. The electrically-conductive ground layer 22 is formed to surround the ground layer 21a. The island of the ground layer 21a is completely isolated from the ground layer 22. The islands of the power supply layer 24 is formed on the upper surface of the third insulating layer 23. The electrically-conductive power supply layer 25 is formed to surround the power supply layer 24 in the same manner as described above. The electrically-conductive piece 37 is formed to connect the island of the power supply layer 24 to the power supply layer 25. The island of the ground layer 21b is formed on the upper surface of the fourth insulating layer 26. The third insulating layer 23 is received on the upper surface of the fourth insulating layer 26. The electrically-conductive ground layer 22 is formed to surround the ground layer 21b in the same manner as described above. The electrically-conductive piece 35 is formed to connect the island of the ground layer 21b to the ground layer 22. The vias 43 function as a shield for the island of the power supply layer 24. This results in a significant reduction of radiation of electromagnetic waves from the island of the power supply layer 24. The via 29 penetrates through the first and second insulating layers 18, 19 and the island of the ground layer 21a. Electric connection is avoided between the via 29 and the island of the ground layer 21a. The ground pin 15 of the LSI chip 13a may be connected to the island of the ground layer 21a through the via 28. The aforementioned via 33 may be connected to the island of the ground layer 21b.

It should be noted that spherical connecting terminals may be employed in place of the power supply pins 14, the ground pins 15 and the signal pins 16 when the LSI chips 13a, 13b, 42 are mounted in the printed circuit board unit 11.

What is claimed is:
1. A printed wiring board comprising:
a first insulating layer;
a first electrically-conductive power supply layer formed on a surface of the first insulating layer;
an island of a second electrically-conductive power supply layer contoured based on a projected image of an electronic circuit element, said second electrically-conductive power supply layer isolated from the first electrically-conductive power supply layer on the surface of the first insulating layer;

a first electrically-conductive piece connecting the second electrically-conductive power supply layer to the first electrically-conductive power supply layer;

a second insulating layer;

a first electrically-conductive ground layer formed on a surface of the second insulating layer;

an island of a second electrically-conductive ground layer contoured based on a projected image of the electronic circuit element, said second electrically-conductive ground layer isolated from the first electrically-conductive ground layer on the surface of the second insulating layer;

a second electrically-conductive piece connecting the second electrically-conductive ground layer to the first electrically-conductive ground layer; and a capacitor connected to the first and second electrically-conductive pieces.

2. The printed wiring board according to claim 1, wherein the second electrically-conductive piece is contoured at least partly based on a projected image of the first electrically-conductive piece.

3. The printed wiring board according to claim 1, wherein the first electrically-conductive piece is connected to the second electrically-conductive power supply layer at a position closer to a clock terminal of the electronic circuit element.

4. The printed wiring board according to claim 1, wherein the second electrically-conductive piece is connected to the second electrically-conductive ground layer at a position closer to a clock terminal of the electronic circuit element.

5. The printed wiring board according to claim 1, wherein the first electrically-conductive power supply layer is divided into islands of electrically-conductive layers isolated from each other on the first insulating layer.

6. The printed wiring board according to claim 1, wherein a combination of the first and second electrically-conductive power supply layers and the first electrically-conductive piece and a combination of the first and second electrically-conductive ground layers and the second electrically-conductive piece are alternately layered on one another.

7. The printed wiring board according to claim 1, wherein the first electrically-conductive ground layer is at least partly superimposed on a projected image of the second electrically-conductive power supply layer.

8. The printed wiring board according to claim 1, further comprising:

a third insulating layer;

a third electrically-conductive power supply layer formed on a surface of the third insulating layer;

an island of a fourth electrically-conductive power supply layer contoured based on a projected image of the electronic circuit element, said fourth electrically-conductive power supply layer isolated from the third electrically-conductive power supply layer on the surface of the third insulating layer; and a third electrically-conductive piece connecting the fourth electrically-conductive power supply layer to the third electrically-conductive power supply layer.

9. The printed wiring board according to claim 1, further comprising:

a third insulating layer;

a third electrically-conductive ground layer formed on a surface of the third insulating layer;

an island of a fourth electrically-conductive ground layer contoured based on a projected image of the electronic circuit element, said fourth electrically-conductive ground layer isolated from the third electrically-conductive ground layer on the surface of the third insulating layer;

a third electrically-conductive piece connecting the fourth electrically-conductive ground layer to the third electrically-conductive ground layer; and vias connecting the second and fourth electrically-conductive ground layers to each other at positions outside the second electrically-conductive power supply layer located in a space between the second and fourth electrically-conductive ground layers.

* * * * *